(12) United States Patent
Cremonesi et al.

(10) Patent No.: US 6,268,247 B1
(45) Date of Patent: Jul. 31, 2001

(54) MEMORY CELL OF THE EEPROM TYPE HAVING ITS THRESHOLD SET BY IMPLANTATION, AND FABRICATION METHOD

(75) Inventors: Carlo Cremonesi, Vaprio d'Adda; Bruno Vajana, Bergamo; Roberta Bottini, Lissone; Giovanna Dalla Libera, Monza, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/431,302

(22) Filed: Oct. 29, 1999

(30) Foreign Application Priority Data

Oct. 30, 1998 (IT) .............................................. MI98A2333

(51) Int. Cl.[7] .............................................. H01L 21/8247
(52) U.S. Cl. .......................................... 438/258; 438/291
(58) Field of Search ..................................... 438/257–267, 438/289, 291, 593–594

(56) References Cited

U.S. PATENT DOCUMENTS 5,792,670 * 8/1998 Pio et al. .

* cited by examiner

Primary Examiner—Richard Booth

(74) Attorney, Agent, or Firm—Theodore E. Galanthay; Robert Iannucci; Seed IP Law Group, PLLC

(57) ABSTRACT

A process forms a structure incorporating at least one circuitry transistor and at least one non-volatile memory cell of the EEPROM type with two self-aligned polysilicon levels having a storage transistor and an associated selection transistor in a substrate of semiconductor material including field oxide regions bounding active area regions. The process comprises the steps of, in the active area regions, forming a gate oxide layer and defining a tunnel oxide region included in the gate oxide layer; depositing and partly defining a first polysilicon layer; forming an interpoly dielectric layer and removing the interpoly dielectric layer at least at the circuitry transistor; depositing a second polysilicon layer; selectively etching away, through a first mask, at least the second polysilicon layer at the cell, and the first and second polysilicon layers at the circuitry transistor; and selectively etching away, through a second mask, the interpoly dielectric layer and the first polysilicon layer at the cell. After the selective etch through said second mask, an implantation step is only carried out through the second mask and at least at the channel region of the floating-gate storage transistor to set the transistor threshold.

20 Claims, 5 Drawing Sheets

MEMORY CELL OF THE EEPROM TYPE HAVING ITS THRESHOLD SET BY IMPLANTATION, AND FABRICATION METHOD

TECHNICAL FIELD

This invention relates to a memory cell of the EEPROM type, in particular of the FLOTOX EEPROM type, whose threshold is set by implantation, and to a method of fabricating such a cell.

BACKGROUND OF THE INVENTION

As is well known, the use of non-volatile memories of the EEPROM type as data storage devices is expanding on account of a specific feature of such memories whereby the information contained in the individual memory cells can be modified electrically in use, both at the writing and the erasing thereof, in an independent selective manner. For the purpose, a selection transistor is provided in series with each cell.

Consistently with today's technology, such storage devices rate very high in terms of reliability.

Concurrently therewith, there exists a demand for high capacity (at least 256 Kb) storage devices, incorporating an ever larger number of cells per memory unit. In this direction, the technology of electronic semiconductors is moving toward ever larger integration scales, and an attendant reduction in component size. However, this involves a more critical control of their characteristics and increased difficulty to ensure an acceptable level of reliability for such advanced cells fabricated to a very large scale of integration (ULSI).

Typically, non-volatile memory cells are integrated in a substrate of a semiconductor material and laid into rows and columns to form a matrix of cells. The cell element wherein the information is stored is a MOS transistor of the floating gate type. The logic state, or level, of the cell is defined by the amount of charge contained in the floating gate of the transistor.

In particular, the amount of charge is altered in EEPROMs by causing charges to flow by tunnel effect (known as Fowler-Nordheim current) through a thin layer of silicon oxide, the so-called tunnel oxide, which intervenes between the substrate of semiconductor material and the floating gate of the transistor.

Of the various types of EEPROMs, those having two levels of polysilicon will be considered here. Their associated memory cells comprise each a floating gate of polysilicon overlying a layer of gate oxide which is formed on top of a silicon substrate, and a control gate, also of polysilicon, overlying the floating gate and being isolated from the latter by a so-called interpoly dielectric layer.

The selection transistor associated with a cell can be variously constructed; for example, it consists of either a single layer of polysilicon or, again, two superposed layers of polysilicon provided above a gate oxide, with an interpoly dielectric layer optionally interposed. Where no interpoly dielectric is provided, it becomes known as a short-circuited double polysilicon construction. If the interpoly dielectric is provided, a short-circuit must anyhow be established between the two layers in appropriate areas of the device, either outside or inside the memory matrix.

In addition, circuitry transistors are usually provided in the device which may have a single polysilicon or double polysilicon with no interpoly dielectric layer. In particular, the last-mentioned instance will be considered in this specification by way of example.

The aforementioned storage structures can be fabricated with technologies that provide for alignment of the control gate to the floating gate. Examples of such processes can be found in U.S. Pat. No. 4,719,184 and European Patent EP-0255159.

One widely employed structure of EEPROM cells with a double level of polysilicon, known as FLOTOX, provides for the floating gate to be extended sideways to the tunnel oxide region outside.

A single memory cell of the FLOTOX type with a double level of polysilicon formed by a standard technique is described in U.S. Pat. Nos. 5,793,673 and 5,792,670, for example. A cross-sectional view of this is given in FIG. 1.

By way of example only, the cell is made with CMOS technology.

Referring to this Figure, the memory cell, generally referenced 1, comprises a series of a floating gate transistor 2 and a selection transistor 3, both of the MOS type, represented in an active area region of a substrate 4 having a first type of conductivity. The cross-section is taken in a parallel direction to the matrix columns, in particular along a source/drain line of the matrix of cells.

The floating gate transistor includes a tunnel oxide region 5 surrounded by a layer 6 of gate oxide. An upper first layer 7 of polysilicon forming the floating gate, and a second layer 8 of polysilicon used to form the control gate, are isolated electrically by an interpoly dielectric layer 9. The latter is usually a triple layer of oxide/nitride/oxide, or ONO, optionally overlaid with a thin layer of polysilicon, the so-called "polino". A low-resistivity silicide layer, not shown in the Figure, is usually provided on top of the second polysilicon layer 8.

The selection transistor 3 similarly includes a gate dielectric 11 beneath the first and second polysilicon layers 7 and 8, with the interpoly dielectric layer 9 extending therebetween.

Source and drain active regions of both transistors, having a second type of conductivity, are shown at 12, 13 and 14. In the storage transistor, they define a channel region 15 that includes specifically a tunnel area 15' under the tunnel oxide region 5. These memories further requires a doped continuity region 16 with a second type of conductivity which is typically formed by implantation and known as the capacitor implant, and which extends from the tunnel area to over the drain region 13 to provide electrical continuity between the substrate region lying beneath the tunnel oxide (tunnel area 15') and the drain region 13 of the cell, in operation.

As can be seen in the Figure, the two polysilicon layers are aligned along the source/drain direction in both the floating gate transistor 2 structure and that of the selection transistor 3.

Referring to FIGS. 2–5, some steps are illustrated therein of a CMOS process adopting a so-called DPCC (short-circuited double poly) flow for making a memory cell of the EEPROM type and a transistor of the external circuitry to the matrix, as is known in the art. It should be noted that both high-voltage or HV transistors, i.e., transistors capable of sustaining high voltages, and low-voltage or LV transistors, i.e., transistors operated at relatively low voltages, are typically formed in the circuitry. They distinguish themselves by the thickness of their gate oxide layer. However, a generic transistor, representing either an LV or a HV transistor, is shown by way of example in the drawings.

The drawings are cross-sectional views taken along the same section line as indicated in FIG. 1.

After defining the active areas, the substrate 4 is grown gate oxide layers 17 and 11 thereon, in the regions of the circuitry 20 and selection 3 transistors, and is grown a gate oxide layer 6 at the region of the storage transistor 2. Also defined is the tunnel oxide region 5 at the floating gate to be formed. The first polysilicon layer 7 is deposited and doped by implantation (FIG. 2). It is then partially defined by means of a mask having openings in the region 2 which lie in planes outside that of the drawings and are not represented.

The interpoly dielectric layer 9 and a thin polysilicon layer 21 are then deposited. The last-mentioned layer provides protection for the underlying interpoly dielectric during the next masking step. At this stage, as shown in FIG. 3, a selective etching step is carried out to remove the thin polysilicon layer 21 and the underlying interpoly dielectric layer 9, in those regions of the storage device where the external circuitry is to be formed, using a mask 22 which leaves the portion intended for the cell matrix covered. More generally, this mask covers the device regions which are intended to accommodate circuit elements with a DPCC structure.

The following step, not illustrated, includes implanting the transistors in the circuitry to define their threshold, the so-called LVS (Low Voltage Shift) implant, e.g., by implantation of a dopant such as boron. This is a low-energy, light-dosage implantation. No mask is needed at the matrix because the interpoly dielectric layer provided therein will screen off the low-energy implant, specifically by the presence of nitride.

Thereafter, the second polysilicon layer 8 and a silicide layer 23 are deposited. A selective etching step is then carried out using the mask 24. During this step, illustrated by FIG. 4, the silicide layer 23, second polysilicon layer 8, and thin polysilicon layer 21 in the matrix are removed, while from the circuitry, only the silicide layer 23 and the second and first polysilicon layers 7 and 8 are removed, there being no interpoly dielectric layer present.

At this stage (FIG. 5), without removing the previous mask 24, a self-aligned etching step is carried out to etch away the intermediate dielectric layer 9 and the first polysilicon layer 7 in the matrix, using a double-resist mask 25. Thus, the cell structure, including the selection transistor, is completely defined in a self-aligned manner. The mask 25 fully exposes the matrix region where the two polysilicon layers are not short-circuited, while completely masking the circuitry region defined during the previous step.

In an advanced process like that just described, whereby the overall size of the memory structure is greatly reduced, a critical factor in current technologies is control of the threshold value of the data storage transistor. In fabricating integrated circuits with methods of the CMOS type, whereto the present invention specifically relates, it is particularly difficult to establish a low threshold voltage with a small gap between the drain and source active regions.

It should be recalled in this respect that non-volatile memories of a standard type are programmed in either of two logic states, namely written and erased, or "0" and "1", to store one bit per cell. A different level of the threshold voltage corresponds to each of them. The cell programming, i.e., the storing of electric charges in the floating gate region, depresses the cell threshold level. Subsequent erasing of the cell brings its threshold back to its former value. The state of a virgin cell corresponds to a voltage level intermediate those of an erased cell and a written cell.

The threshold values are determined by the cell structure, as well as by construction features and properties of the materials comprising it. In a standard memory cell, reading the threshold value of a virgin cell may cause trouble at the programming stage. In particular, the problem is one of being able to set the threshold value of a virgin cell such that it can be read as if it were a written cell or an erased cell, according to the specific requirements of the device which is to include it.

SUMMARY OF THE INVENTION

A most effective solution is that of adding a memory cell implanting step, so that its threshold could be set as appropriate. It should be considered that the threshold jump between written and erased cell, which represents the range in which the cell is operated through its life span, becomes smaller as the device is tested for reliability. Accordingly, it should be possible to sufficiently discriminate a virgin threshold value from those of an erased or written cell.

It should be further noted that, in current process flows for manufacturing ever more sophisticated devices, the device complexity and accuracy usually involve the need for additional process steps, which is at issue with the urge to keep manufacturing costs as low as possible.

In the light of the foregoing, it is an object of this invention to have an EEPROM cell fabricated by a process which allows the threshold voltage of the cell to be set without added complications or costs.

An embodiment of the invention provides a self-aligned method of forming an integrated structure which comprises non-volatile memory cells of the EEPROM type with a double level of polysilicon and an associated selection transistor in a semiconductor material substrate. The memory cell includes a storage transistor having a control gate overlying and being isolated from a floating gate which is coupled, by tunnel oxide, to a tunnel area provided in said substrate and included in a channel region with a first type of conductivity interposed between first and second active regions with a second type of conductivity. In addition, a region of electrical continuity having a second type of conductivity extends from said tunnel area to partly overlie said first active region.

The process provides for an implanting operation to be carried out at least in the channel region of the floating-gate storage transistor to set the transistor threshold.

The threshold of the storage transistor can be modified by an implantation carried out after the first and second polysilicon layers are fully defined. For the purpose, the same mask is used as had previously been exposed for the self-aligned etching of the two polysilicon layers in the matrix. In this way, the need to form a special mask for the implantation is eliminated.

Preferably, the process further provides for the mask used in the self-aligned etching of the underlying polysilicon layer to be only exposed after removing the previous resist mask used for etching away the overlying polysilicon. Thus, no intermediate step of mask forming and/or removing after the self-aligned etch is required to effect the implantation according to the invention.

BRIEF DESCRIPTION OF THE DRAWINGS

The features and advantages of this invention will become more clearly apparent from the detailed description of an embodiment thereof, illustrated by way of example and not of limitation by the accompanying drawings.

DETAILED DESCRIPTION OF THE INVENTION

Figure 1:
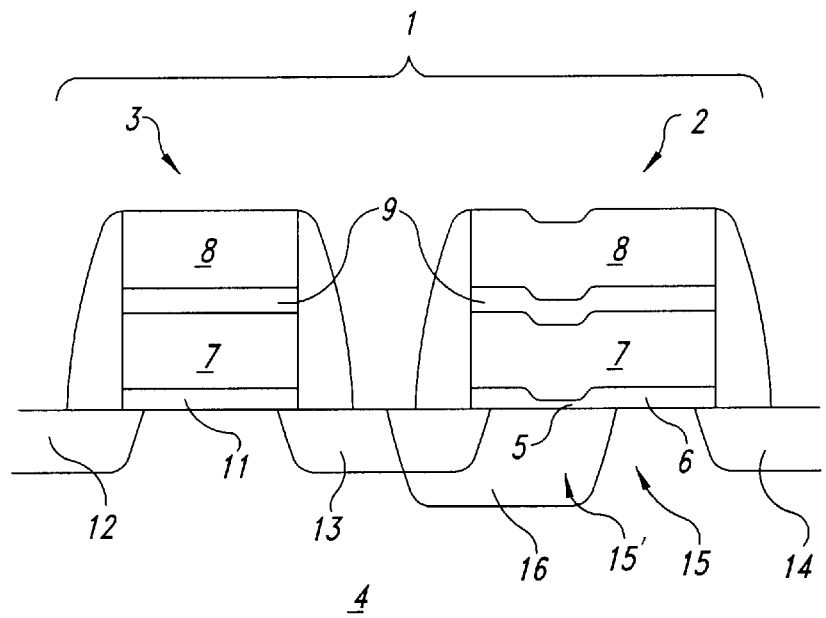
FIG. 1 shows an EEPROM non-volatile memory cell as formed by a conventional technique.
Figure 2:
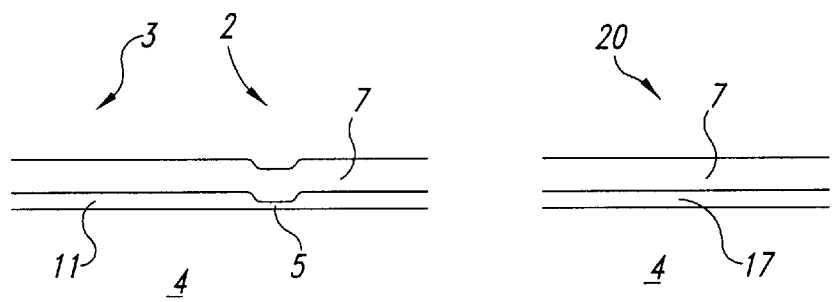
FIGS. 2–5 illustrate some significant steps of a process for forming an EEPROM non-volatile memory cell and an external-circuitry transistor by a conventional technique.
Figure 3:
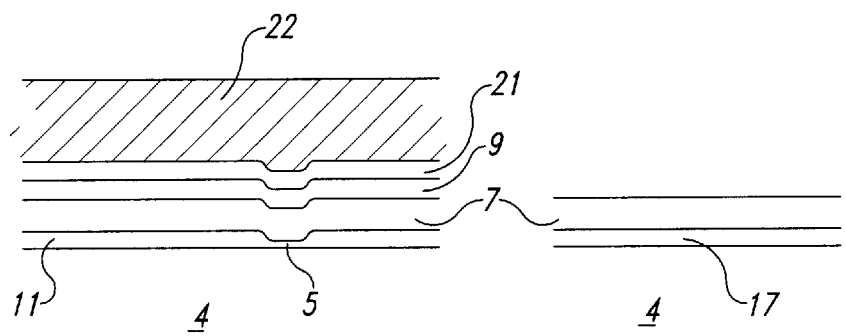
Figure 4:
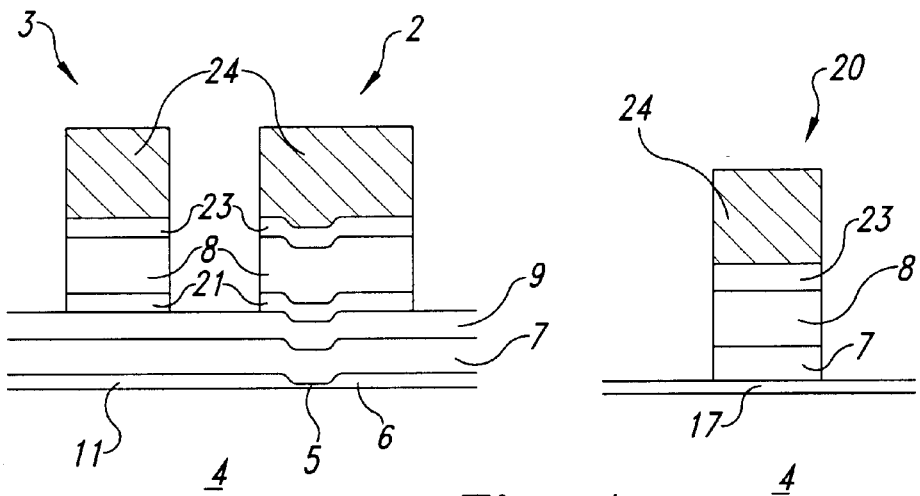
Figure 5:
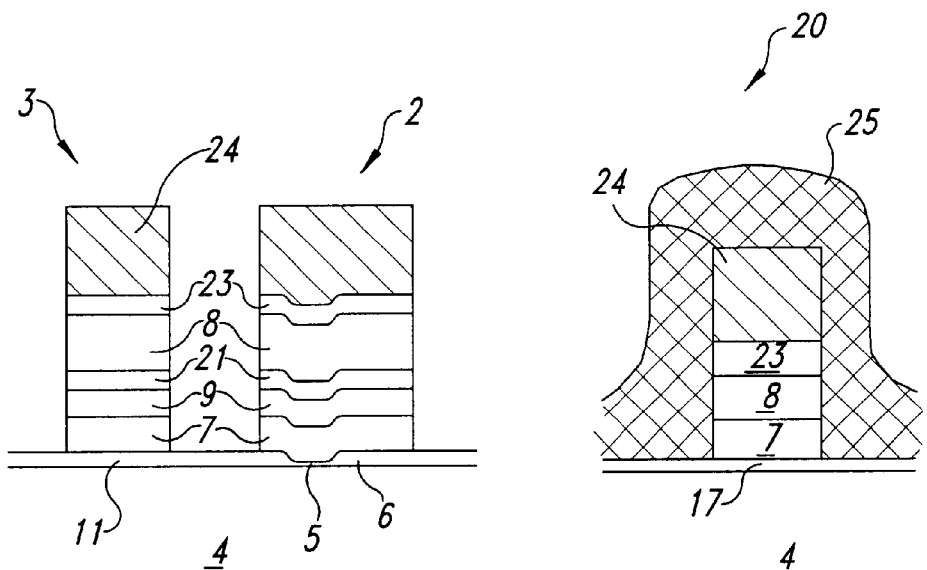

A preferred process for forming memory cells of the EEPROM type and external-circuitry transistors is illustrated by FIGS. 6–10 in relation to a self-aligned process of the CMOS DPCC type similar to that described in connection with the prior art of FIGS. 2–5.

The process is run in a standard flow up to the formation and associated implantation of the second polysilicon layer 8. The active oxides of the device, namely the gate oxides 11, 6, 17 and tunnel oxide 5, are formed in active area regions bounded by field oxide regions, the latter being omitted from the drawings. Where at least two types of circuitry transistors having different gate thicknesses are simultaneously present, the process typically includes the steps of growing a first gate oxide; removing it everywhere except from the high-voltage transistor areas; growing a second gate oxide to provide the gate oxides for both transistor types; removing the oxides from the tunnel region; and growing the tunnel oxide.

A first polysilicon layer 7 is then formed by deposition in both the circuitry region and the matrix region. It is then partially defined along a perpendicular direction to the source/drain direction. The interpoly dielectric layer 9 is formed next, preferably along with the thin polysilicon layer 21 which functions as a protection for the dielectric beneath during the next masking step. Thereafter, these two layers are removed from the region of the external circuitry transistor 20 using the mask 22 (see FIG. 3).

This is followed by an LVS implanting step of the circuitry transistors in order to set their threshold values. The second polysilicon layer 8 is then deposited and doped by implantation. A low-resistance silicide layer 23 is preferably deposited thereon.

At this stage, according to the preferred embodiment of this invention, a masking dielectric layer 32 is formed. This is, preferably, a silicon oxide formed by a CVD (Chemical Vapor Deposition) process, using TEOS, i.e., tetraethylorthosilicate, for a precursor.

Figure 6:
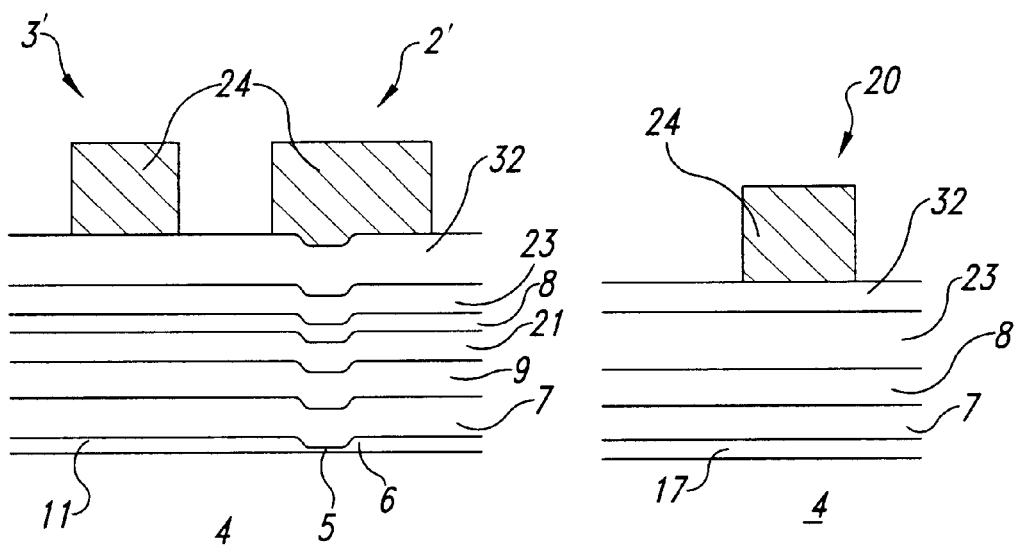
FIGS. 6–9 illustrate schematically some steps of a process for forming an EEPROM non-volatile memory cell and an external-circuitry transistor, according to this invention.

The standard mask 24—used for partially defining the silicide layer 23, second polysilicon layer 8, and thin polysilicon layer 21 in the matrix region, as well as the second and first polysilicon layers 8 and 7 in the circuitry region—is then exposed above the TEOS layer 32 (FIG. 6). The mask 24 is typically comprised of a photoresist.

Figure 7:
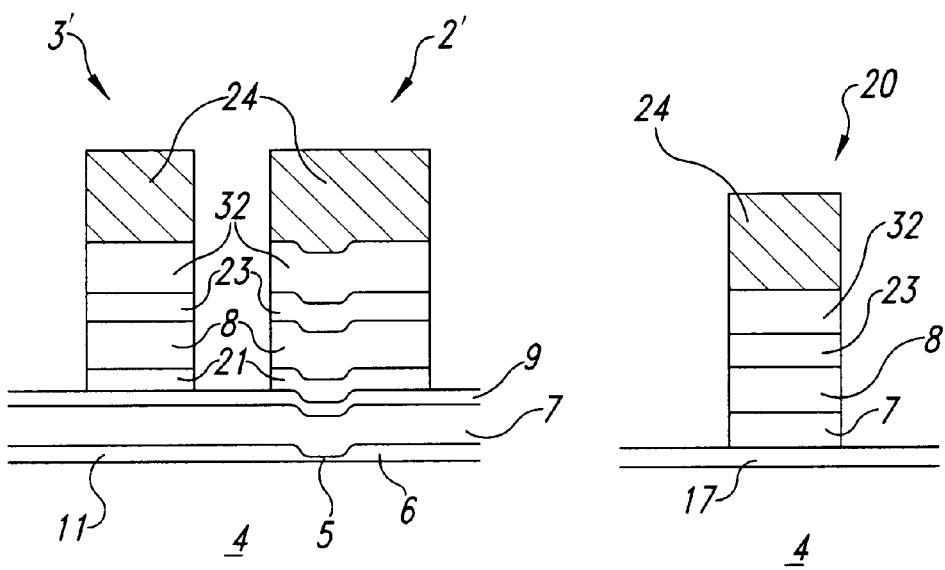
Figure 8:
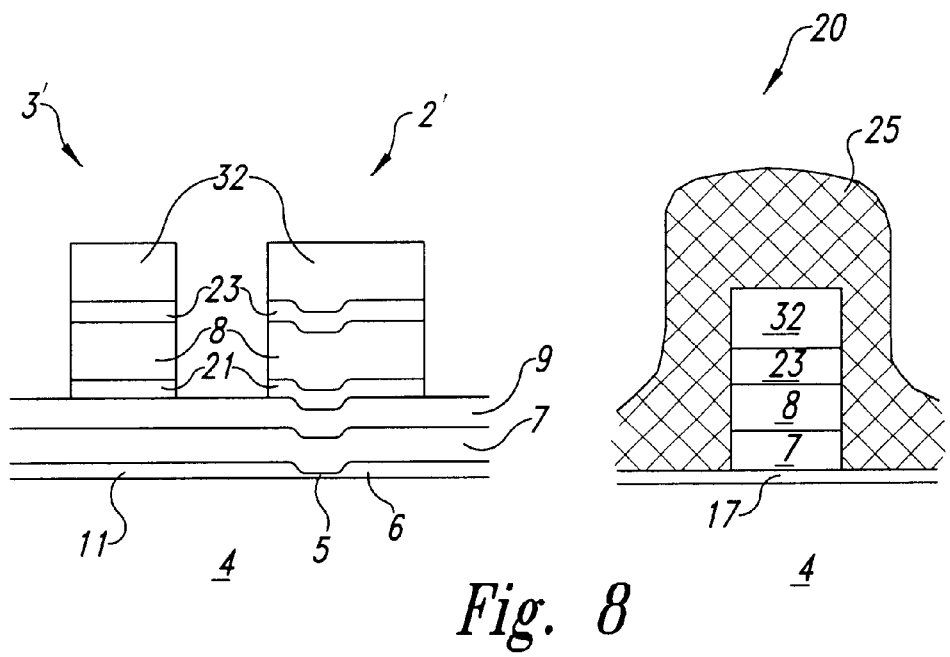

The etching through the mask 24, additionally to defining the second polysilicon layer in the matrix region and both polysilicon layers in the circuitry region, will remove and, hence, define the TEOS layer 32 as well, as shown in FIG. 7. The last-mentioned layer is to function as a masking layer during the following self-aligned memory cell etching step.

For the purpose, it can be removed once the etch through the mask 24 is completed. The mask 25, which typically comprises a photoresist and covers the region of the circuitry 20 (FIG. 8), is exposed next.

The interpoly dielectric 9 and first polysilicon layer 7 are etched away in the matrix region. During the etch, the TEOS layer 32 can serve as a mask because of the etch selectivity in the respect of polysilicon. There will just occur a small decrease in the thickness of the layer 32, which should be suitably selected on this account, preferably in the 1500 to 2500 Å range.

Figure 9:
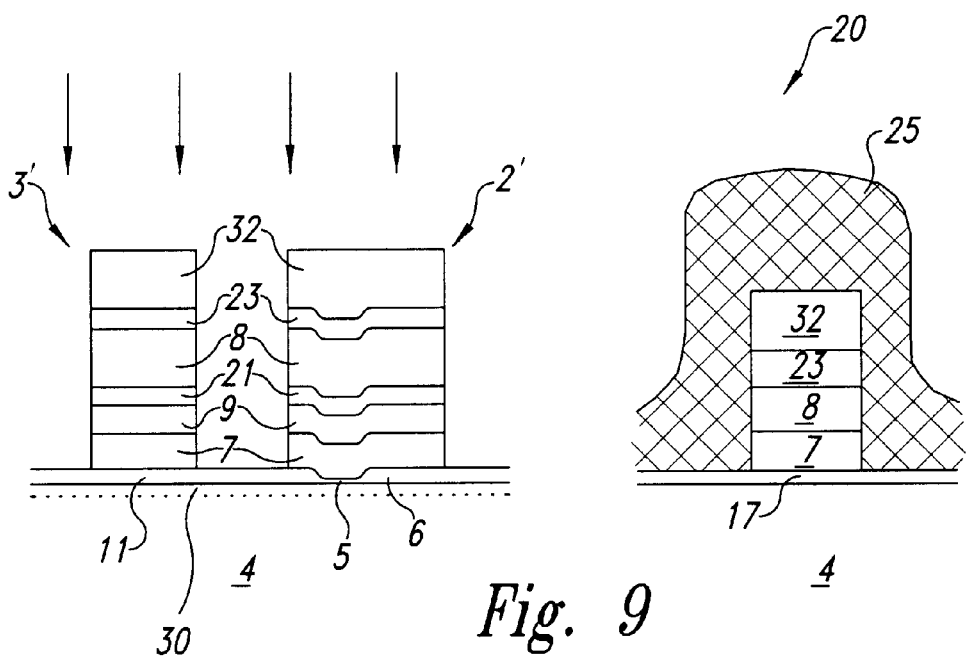
Figure 10:
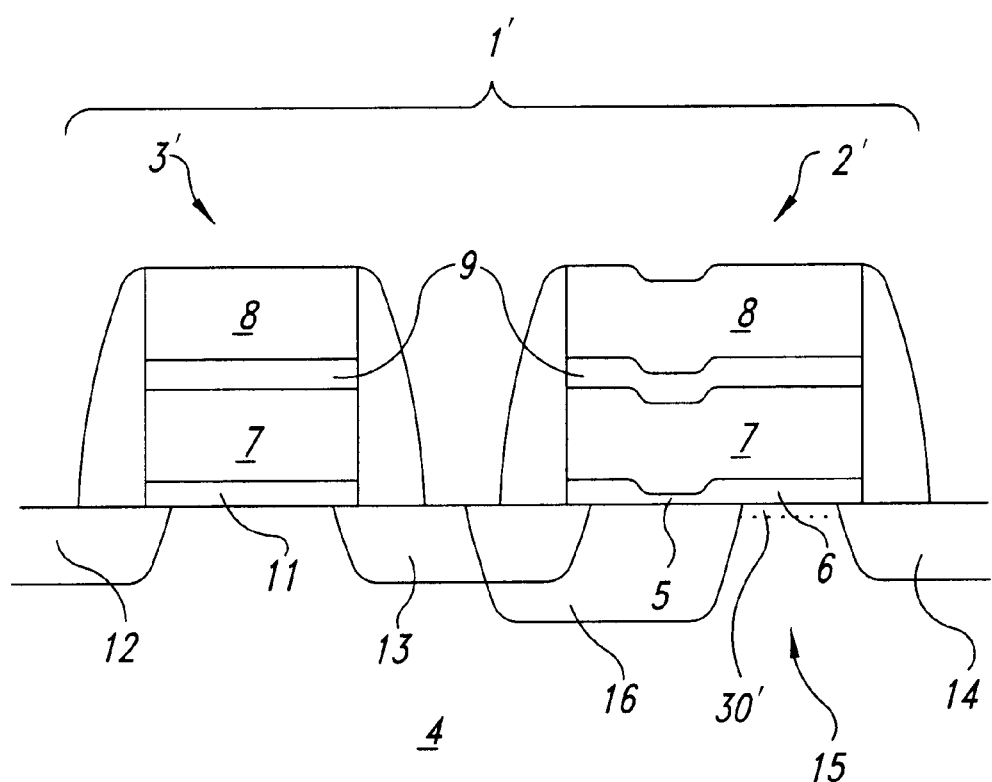
FIG. 10 shows a cross-section through an EEPROM cell at the final stage of its fabrication according to one embodiment of this invention.

In accordance with this invention, and as shown in FIG. 9, after the self-aligned etch, the mask 25, completely uncovering the region of the memory cell matrix and covering the circuitry, is used to carry out an implantation, as indicated by arrows in FIG. 10, with dosage and energy characteristics adequate to enable the threshold voltage of the cell to be set. It should be noted that the masking dielectric layer 32, unlike the masking photoresist layer, should be transparent to the implant that, accordingly, will span the whole region uncovered by the standard mask 25. TEOS, and in general a silicon oxide, will exhibit this property.

Thus, a shallow region 30 is formed in the channel region 15, as indicated by the hatched area, wherein the dopant concentration is higher than in the substrate.

Advantageously, there is no need to redesign a mask specially for this, and a mask already provided in the process flow can be used instead, resulting in obvious savings. Nor is any intermediate step required after the self-aligned etch.

The implant typically consists of dopant of the P type, boron ions in the preferred embodiment. The implanting operation is carried out at a light dosage, and the dopant reaches deep enough to change the cell threshold. The depth of the region 30 is preferably of a few hundred Ångströms, typically in the 200–300 Å range.

Notice that the implantation goes through the cell structure, that is, through a stack of layers which comprise essentially two polysilicon layers and the intermediate dielectric, and that the nitride content of the latter is adequate to screen off low-energy implantations. Accordingly, the implantation should be carried out at a relatively high energy compared to the LVS implantation for changing the threshold of the circuitry transistors, which is performed through a single polysilicon. In one practical embodiment, the implantation was performed at an energy of 230 KeV. However, an implantation is preferred, as being advantageous according to the invention, which has dosage characteristics in the same order of magnitude as the LVS implantation.

Advantageously in this process, a single photoresist layer is provided during the self-aligned etch, resulting in a lower fault rate than with a double masking.

It should be noted that, since according to the invention the implantation is effected after forming the interpoly dielectric layer, it advantageously does not undergo the thermal treatments to which the device is subjected during that step and is controllable.

The process is then carried to completion through the standard implanting steps, the steps of forming sidewall oxide spacers, depositing a dielectric insulating layer, and forming the contact openings and the metallization layers.

It can be seen from the Figures that the cell has a shallow implant 30 across its active area, at both the floating-gate storage transistor 2' and the selection transistor 3'.

Throughout the foregoing description, it has been assumed that the two polysilicon layers in the selection transistor were not short-circuited (non-DPCC). However, a similar process would also be applicable to a DPCC type of selection transistor, by suitable modification of the masks 22 and 25. In this case, according to the invention, by using the self-aligned mask for the implantation, the selection transistor can be prevented from becoming implanted, thereby keeping its threshold and the so-called body effect under better control.

FIG. 10, showing a cross-section through just memory cell 1', illustrates an exemplary device as obtained with this alternative process. It can be seen that, in the finished structure of the cell, the implant, shown at 30', only locates at the channel of the floating-gate storage transistor 2'.

Furthermore, a process would also be within the scope of this invention which does not include forming the masking dielectric layer 32, provided that the implanting step is carried out after the self-aligned etching through the mask 25 and after removing the mask 24.

It is understood that changes and modifications can be made unto the process described and illustrated hereinabove, within the scope of the present invention as defined in the appended claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for forming a structure incorporating at least one circuitry transistor and at least one non-volatile memory cell of the EEPROM type with two self-aligned polysilicon levels having a storage transistor and an associated selection transistor in a substrate of semiconductor material including field oxide regions bounding active area regions, which process comprises the steps of:

in said active area regions, forming a gate oxide layer and defining a tunnel oxide region included in said gate oxide layer;

depositing and partly defining a first polysilicon layer;

forming an interpoly dielectric layer and removing said interpoly dielectric layer at least at said circuitry transistor;

depositing a second polysilicon layer;

selectively etching away, through a first mask, at least said second polysilicon layer at said cell and said first and second polysilicon layers of said circuitry transistor;

selectively etching away, through a second mask, said interpoly dielectric layer and said first polysilicon layer at said cell;

following the selective etch through said second mask, implanting dopant through said second mask at least at the channel region of the storage transistor for setting a threshold of the storage transistor.

2. A process according to claim 1 wherein, following the deposition of said second polysilicon layer, a masking dielectric layer is formed, and wherein said selective etching step through said first mask further includes etching away said masking dielectric, followed by removal of said first mask before the selective etching through said second mask, wherein said implanting step is carried out through said masking dielectric layer at least at said storage transistor.

3. A process according to claim 2 wherein said masking dielectric layer is a silicon oxide.

4. A process according to claim 3 wherein said silicon oxide comprises tetraethylorthosilicate (TEOS).

5. A process according to claim 2 wherein the thickness of said masking dielectric layer is in the range of 1500 Å to 2500 Å.

6. A method according to claim 1, further including an implantation step for setting the threshold of said circuitry transistor, said step of implanting the storage transistor of the matrix is carried out at the same dosage as said step of implanting the circuitry transistors.

7. A method according to claim 1 wherein said implantation is carried out using dopant of the P type.

8. A method according to claim 7 wherein said implantation is carried out using boron ions.

9. A process for forming a memory device that includes a storage transistor and a circuitry transistor, the process comprising:

forming a gate oxide layer on a storage transistor portion of a semiconductor substrate and on a circuitry transistor portion of the substrate;

forming first and second polysilicon layers over the gate oxide layer at the storage transistor and circuitry transistor portions;

forming an interpoly dielectric layer between the first and second polysilicon layers at the storage transistor portion;

forming a first mask that covers the first and second polysilicon layers at the circuitry transistor portion and has gaps at the storage transistor portion;

selectively etching away, through the gaps in the first mask, exposed portions of the interpoly dielectric layer and the first polysilicon layer at the storage transistor portion;

following the selective etch through the first mask, implanting dopant into the storage transistor portion of the substrate for setting a threshold of the storage transistor while the first mask protects the circuitry transistor portion from the dopant.

10. The process of claim 9, further comprising:

forming a second mask prior to forming the first mask, the second mask covering the first and second polysilicon layers at a gate region of the storage transistor portion and the first and second polysilicon layers at a gate region of the circuitry transistor, the second mask having gaps above source and drain regions of the storage and circuitry transistors, the source and drain regions of the storage transistor being immediately adjacent to the gate region of the storage transistor and the source and drain regions of the circuitry transistor being immediately adjacent to the gate region of the circuitry transistor; and selectively etching away, through the gaps in the second mask, the portions of the first and second polysilicon layers at the source and drain regions of the circuitry transistor and the portions of the second polysilicon layer and the source and drain regions of the storage transistor.

11. The process of claim 9, further comprising:

forming a masking dielectric layer above the first and second polysilicon layers at a gate region of the storage transistor and at a gate region of the circuitry transistor, the masking dielectric layer having gaps adjacent to the gate regions; and selectively etching, through the gaps in the first mask and the gaps in the masking dielectric layer, the first polysilicon layer and interpoly dielectric layer adjacent to the gate region of the storage transistor.

12. The process of claim 11 wherein the implanting dopant step implants dopant through the dielectric masking layer at the gate region of the storage transistor.

13. The process of claim 11 wherein the masking dielectric layer is a silicon oxide.

14. The process of claim 13 wherein the silicon oxide comprises tetraethylorthosilicate (TEOS).

15. The process of claim 11 wherein the masking dielectric layer has a thickness in the range of 1500 Å to 2500 Å.

16. A process for forming a memory device that includes a storage transistor and a circuitry transistor, the process comprising:

forming a gate oxide layer on a storage transistor portion of a semiconductor substrate and on a circuitry transistor portion of the substrate;

forming first and second polysilicon layers over the gate oxide layer at the storage transistor and circuitry transistor portions;

forming an interpoly dielectric layer between the first and second polysilicon layers at the storage transistor portion;

forming a masking dielectric layer that covers the first and second polysilicon layers at a gate region of the storage transistor and at a gate region of the circuitry transistor, the masking dielectric layer having gaps adjacent to the gate regions;

forming a first mask above the masking dielectric layer, the first mask covering the first and second polysilicon layers at the gate regions of the storage and circuitry transistors, the first mask having gaps adjacent to the gate regions;

selectively etching away, through the gaps in the first mask and the gaps in the masking dielectric layer, exposed portions of the second polysilicon layer adjacent to the gate region of the storage transistor;

selectively etching away, through the gaps in the masking dielectric layer, exposed portions of the interpoly dielectric layer and the first polysilicon layer at the storage transistor portion;

removing the first mask; and after removing the first mask, implanting dopant through the dielectric masking layer at the gate region of the storage transistor into the storage transistor portion of the substrate for setting a threshold of the storage transistor.

17. The process of claim 16, further comprising:

forming a second mask that covers the first and second polysilicon layers at the circuitry transistor and has a gap at the storage transistor that leaves exposed the dielectric masking layer at the storage transistor, wherein the step of implanting dopant includes implanting dopant through the gap in the second mask.

18. The process of claim 17 wherein the step of selectively etching away the second polysilicon layer at the storage transistor is performed before the second mask is formed at the circuitry transistor and the step of selectively etching away the first polysilicon layer and the interpoly dielectric layer is performed after the second mask is formed at the circuitry transistor.

19. The process of claim 16 wherein the masking dielectric layer comprises tetraethylorthosilicate (TEOS).

20. The process of claim 16 wherein the masking dielectric layer has a thickness in the range of 1500 | to 2500 Å.

* * * * *

UNITED STATES PATENT AND TRADEMARK OFFICE
CERTIFICATE OF CORRECTION

PATENT NO.   : 6,268,247 B1
DATED        : July 31, 2001
INVENTOR(S)  : Carlo Cremonesi et al.

It is certified that error appears in the above-identified patent and that said Letters Patent is hereby corrected as shown below:

<u>Column 10, claim 20,</u>
Line 32, "in the range of 1500 | to 2500 Å" should read -- in the range of 1500Å to 2500Å --.

Signed and Sealed this

Twenty-ninth Day of January, 2002

Attest:

JAMES E. ROGAN
Attesting Officer     Director of the United States Patent and Trademark Office